United States Patent
Kirkpatrick et al.

(10) Patent No.: US 6,861,348 B2
(45) Date of Patent: Mar. 1, 2005

(54) PRE-PATTERN SURFACE MODIFICATION OF LOW-K DIELECTRICS

(75) Inventors: Brian K. Kirkpatrick, Allen, TX (US); Michael Morrison, Tempe, AZ (US); Andrew J. McKerrow, Dallas, TX (US); Kenneth J. Newton, McKinney, TX (US); Dirk N. Anderson, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/982,654

(22) Filed: Oct. 18, 2001

(65) Prior Publication Data

US 2002/0111037 A1 Aug. 15, 2002

Related U.S. Application Data

(60) Provisional application No. 60/255,714, filed on Dec. 14, 2000.

(51) Int. Cl.[7] .......................................... H01L 21/4763
(52) U.S. Cl. ........................ 438/626; 438/633; 438/638; 438/672
(58) Field of Search ................................ 438/624, 626, 438/631, 633, 637–639, 672, 675, 677, 689, 694, 699, 700, 723, 743, 906, 763

(56) References Cited

U.S. PATENT DOCUMENTS

| | | | | | |
|---|---|---|---|---|---|
| 5,880,019 | A | * | 3/1999 | Hsieh et al. | 438/666 |
| 5,968,851 | A | * | 10/1999 | Geha et al. | 438/756 |
| 5,970,376 | A | * | 10/1999 | Chen | 438/637 |
| 6,136,680 | A | * | 10/2000 | Lai et al. | 438/597 |
| 6,177,364 | B1 | * | 1/2001 | Huang | 438/792 |
| 6,465,352 | B1 | * | 10/2002 | Aoki | 438/689 |
| 6,472,335 | B1 | * | 10/2002 | Tsai et al. | 438/780 |
| 6,492,257 | B1 | * | 12/2002 | Shields et al. | 438/622 |
| 6,551,943 | B1 | * | 4/2003 | Eissa et al. | 438/718 |
| 6,605,536 | B2 | * | 8/2003 | Eissa et al. | 438/687 |
| 6,620,560 | B2 | * | 9/2003 | Jiang et al. | 430/5 |
| 6,720,247 | B2 | * | 4/2004 | Kirkpatrick et al. | 438/622 |
| 2002/0088476 | A1 | * | 7/2002 | Cowley et al. | 134/1.2 |
| 2002/0127840 | A1 | * | 9/2002 | Smith et al. | 438/618 |

* cited by examiner

*Primary Examiner*—George Fourson
*Assistant Examiner*—Brook Kebede
(74) *Attorney, Agent, or Firm*—Jacqueline J. Garner; W. James Brady, III; Frederick J. Telecky, Jr.

(57) ABSTRACT

A low-k dielectric layer (104) is treated with a dry-wet (D-W) or dry-wet-dry (D-W-D) process to improve patterning Resist poisoning occurs due to an interaction between low-k films (104), such as OSG, and DUV resist (130). The D-W or D-W-D treatment is performed to either pretreat a low-k dielectric (104) before forming the pattern (130) or during a rework of the pattern (130).

16 Claims, 1 Drawing Sheet

PRE-PATTERN SURFACE MODIFICATION OF LOW-K DIELECTRICS

This application claims priority under 35 USC § 119(e)(1) of provisional application No. 60/255,714 filed Dec. 14, 2000.

FIELD OF THE INVENTION

The invention is generally related to the field of forming interconnect layers in a semiconductor device and more specifically to patterning low-k dielectric films.

BACKGROUND OF THE INVENTION

As the density of semiconductor devices increases, the resistance-capacitance (RC) delay time in the back-end-of the-line (BEOL) increases and dominates the circuit performance. To reduce RC delay time at BEOL, the demands on interconnect layers for connecting the semiconductor devices to each other also increase. Therefore, there is a desire to switch from the traditional aluminum metal interconnects to copper interconnects and from traditional silicon-dioxide-based dielectrics to low-k dielectrics, such as organo-silicate glass (OSG). Semiconductor fabrication processes for working with the copper interconnects and newer low-k dielectrics are still needed.

As compared to the traditional subtractive plasma dry etching of aluminum, suitable copper etches for a semiconductor fabrication environment are not readily available. To overcome the copper etch problem, damascene processes have been developed. In a damascene process, the IMD (intra-metal dielectric) is formed first. The IMD is then patterned and etched to form trenches for the interconnect lines. If connection vias have not already been formed, a dual damascene process may be used. In a dual damascene process, an ILD (interlevel dielectric) is deposited before the IMD. An etch-stop layer, such as SiN, can be optionally used in between the IMD and the ILD. The via is formed in the ILD for connection to lower interconnect levels and the trench is formed in the IMD. A barrier layer and a copper seed layer are then deposited over the structure. The barrier layer is typically tantalum nitride or some other binary transition metal nitride. The copper layer is electrochemically deposited (ECD) using the seed layer over the entire structure. The copper is then chemically-mechanically polished (CMP'd) to remove the copper from over the IMD, leaving copper interconnect lines and vias. A metal etch is thereby avoided.

When low-k dielectrics such as OSG are used for the IMD and ILD, a problem known as resist poisoning occurs. Resist poisoning occurs during a patterning step such as via pattern or trench pattern. It is a result of the interaction between a DUV (deep ultra-violet) resist and low-k films. Resist poisoning causes poor resist sidewall profiles, resist scumming, and large CD variations. Furthermore, the required resist exposure dose to achieve the target CD becomes too high and varies with film aging. A process to reduce or eliminate resist poisoning in low-k dielectrics is therefore desired.

SUMMARY OF THE INVENTION

The invention is a surface treatment for low-k films that improves patterning. The low-k film is treated with a dry-wet (D-W) process to eliminate or significantly reduce resist poisoning. An optional dry (D) process can follow the D-W process. The D-W or D-W-D treatment can be performed at various stages in the semiconductor fabrication process with or without the presence of resist. For example, this treatment can be applied to as-deposited low k films before patterning (pre-treatment) or to stripping photoresist for lithograph rework.

An advantage of the invention is providing a treatment to reduce or eliminate resist poisoning of low-k dielectric films.

This and other advantages will be apparent to those of ordinary skill in the art having reference to the specification in conjunction with the drawings.

DETAILED DESCRIPTION OF THE EMBODIMENTS

The invention will now be described in conjunction with dual damascene copper interconnect process. It will be apparent to those of ordinary skill in the art that the benefits of the invention may be applied generally to patterning of low-k (K<3.0) and ultra-low-k (K<2.5) films.

Figure 1A:
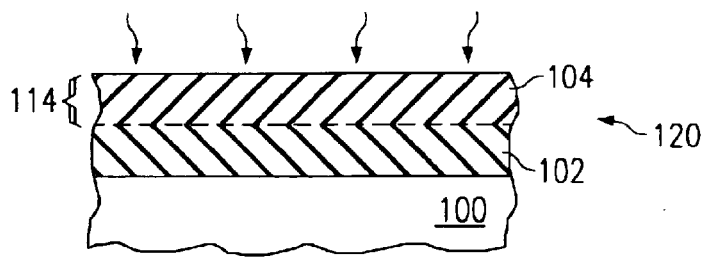
FIGS. 1A–1F are cross-sectional diagrams of a process for forming metal interconnects according to the embodiments of the invention.

In order to form the copper interconnects using a dual damascene process, the interlevel dielectric (ILD 102) and intrametal dielectric (IMD 104) in FIG. 1A are patterned and etched to form trenches in IMD 104 and vias in ILD 102. When low-k or ultra low-k materials are used for the ILD and IMD, an interaction between the resist and the low-k materials causes resist poisoning. The cause of resist poisoning is believed to be the interaction of between the DUV resist and nitrogen-containing reagents from the low-k films. Possible sources of nitrogen include: the low-k film, the dielectric cap, the optional IMD etch-stop layer (e.g., SiN), $N_2$ in the clean (ash) process, $N_2$ in the etch chemistry, and the photoresist itself.

In order to reduce or eliminate the resist poisoning, a pre-pattern treatment using a dry-wet (D-W) or dry-wet-dry (D-W-D) process is performed. The dry process comprises a reducing-type plasma with a gas chemistry of $H_2$ with an inert gas such as argon or nitrogen. The first dry process is an ash-type process. The wet process functions as a clean to remove any etch polymers and surface particles. The wet chemistry may comprise one of the following: HF/organic acid (such as citric, acetic, gallic, and oxallic); HF; citric; a solvent such as NE-14 (a solvent from Ashland) or AP360 (a solvent from ATMI); or $H_2SO_4$. The final optional dry process is used for passivation and may also be comprised of $H_2/N_2$ or $H_2/Ar$ plasma. In the preferred embodiment, a $H_2/Ar$ plasma is used followed by treatment with the NE-14 solvent from Ashland.

As an example, the following $H_2/Ar$ plasma process may be used for the first dry step:

| | |
|---|---|
| Time: | 1–3 min., preferably 2 min. |
| Pressure: | 500–1500 mT, preferably 700 mT |
| Power: | 600–1000 W, preferably 950 W |
| Flow: | 1000–3000 sccm $H_2$, preferably 3000 sccm |
| | 500–2000 sccm Ar, preferably 2000 sccm |
| Chuck Temp.: | 150–265° C., preferably 250° C. |

For the wet step, the process conditions depend on the solution used. For example, for $H_2SO_4$ a temperature in the range of 56–61° C. is optimal. In addition, the surface of the structure may be pre-wet with a wetting agent such as deionized water. As another example, NE-14 may be used at a temperature in the range of 23° C. to 35° C., preferably 27° C. for a duration in the range of 5–20 minutes, preferably 5 minutes.

For the final dry step, the following $H_2$/Ar plasma process may be used:

| | |
|---|---|
| Time: | 1–3 min., preferably 2 min. |
| Pressure: | 500–1500 mT, preferably 700 mT |
| Power: | 500–1000 W, preferably 700 W |
| Flow: | 300–1000 sccm $H_2$, preferably 500 sccm |
| | 300–1000 sccm Ar, preferably 500 sccm |
| Chuck Temp.: | 50–75° C., preferably 60° C. |

In both the initial and final dry steps, lower temperature and lower pressure give the best result at the cost of reduced rate (i.e., longer process time). Limitations of the current tool capabilities are also considered.

Embodiments of the invention will now be discussed with reference to FIGS. 1A–1F. A semiconductor body 100 is processed through formation of the ILD 102/IMD 104. Semiconductor body 100 typically comprises a silicon substrate having transistors and other elements formed therein. IMD 104 is the dielectric for a copper interconnect level. Copper interconnect level may be the first or any subsequent metal interconnect level of the semiconductor device 120.

An ILD 102 is formed over semiconductor body 100. IMD 104 is formed over ILD 102. A trench etch-stop layer (not shown) may optionally be placed between ILD 102 and IMD 104. ILD 102 and IMD 104 comprise low-k or ultra low-k dielectrics, such as organo-silicate glass (OSG). In the preferred embodiment, ILD 102 and IMD 104 comprise the same material. However, ILD 102 and IMD 104 may alternatively comprise different materials. A capping layer (not shown) may be formed over IMD 104 if desired. Typically, the capping layer comprises silicon nitride, Alternatively, silicon oxide, silicon oxynitride (SiON), or Si-rich nitride (SRN) or SiC capping layer, or no capping layer may be used.

Figure 1B:
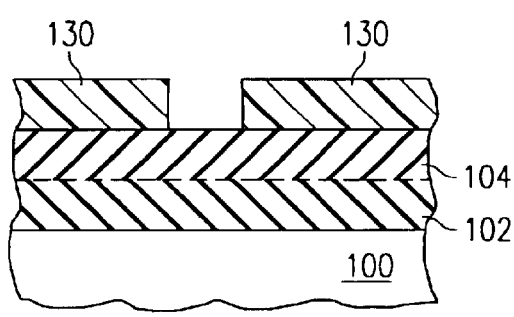

In a first embodiment of the invention, the pre-pattern D-W or D-W-D treatment is performed prior to forming the via pattern 130. Then, the via pattern 130 is formed as shown in FIG. 1B. The pre-pattern D-W or D-W-D treatment reduces resist poisoning at the via pattern level.

It is sometimes necessary to rework a resist pattern. Rework is a process of removing the photoresist and/or BARC material for re-patterning. Pattern re-work significantly worsens the resist poisoning problem if a non-optimized ash process is used for re-work. Accordingly, in a second embodiment of the invention, the D-W or D-W-D treatment is used to rework via pattern 130. Using the D-W or D-W-D treatment according to the invention as a pattern re-work reduces or eliminates resist poisoning associated with the via pattern.

When the D-W or D-W-D treatment is instead used in addition to a conventional wet or dry resist rework process, resist poisoning is caused by the other processing is only reduced. Accordingly, it is preferred to use the D-W or D-W-D process as the pattern re-work instead of in addition to other rework processes.

Figure 1C:
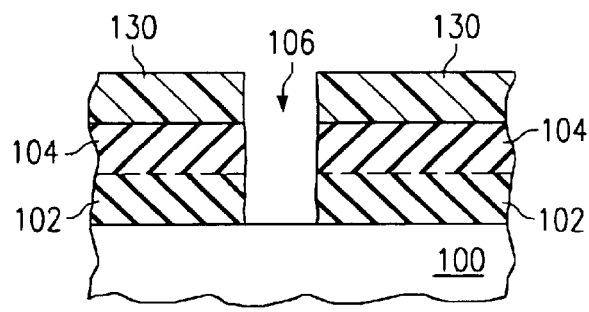

After any desired pattern re-work, the via 106 is then etched through IMD 104 and ILD 102, as shown in FIG. 1C. In order to protect the bottom of via 106 during the subsequent trench etch, via 106 may be partially or completely filled. For example, an organic barc (bottom anti-reflection coating) may be deposited over the structure and etched back such that BARC material remains only in the vias 106.

After a post via etch clean, the D-W or D-W-D process of the invention may be used as a pre-trench pattern treatment. For some applications, pre-treatment at the trench pattern level may be more critical than at the via pattern level.

Figure 1D:
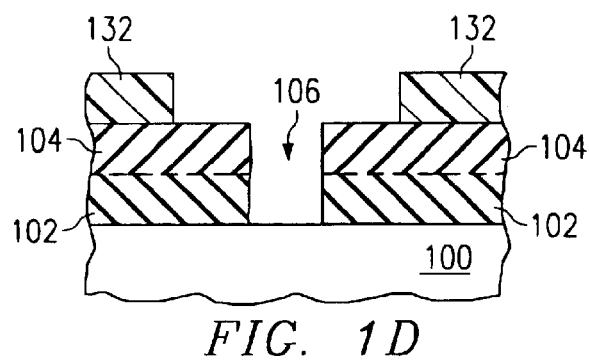
Figure 1E:
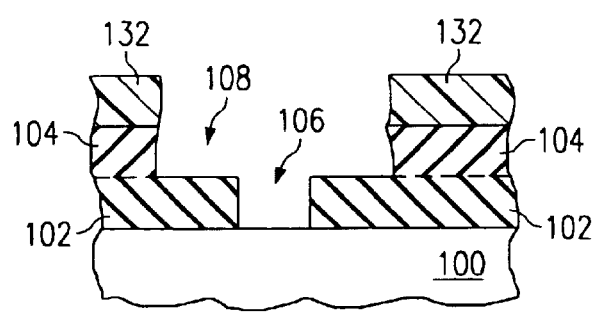

After the post via clean and any desired pattern pre-treatment, a trench pattern 132 may be formed over IMD 104, as shown in FIG. 1D. After any desired pattern rework, a trench 108 is etched in IMD 104, as shown in FIG. 1E. Trench pattern 132 is then removed.

Barrier layer 110 is deposited over IMD 104 including in trench 108 and via 106. Barrier layer 110 functions to prevent copper diffusion into the ILD and IMD layers. Suitable barrier materials such as Ta/TaN are known in the art. A seed copper layer is then deposited over barrier layer 110.

Electrochemical deposition (ECD) may then be used to deposit copper layer 124. Various copper ECD processes are known in the art. In one example, a 3-step process is used. After placing the wafer in the plating solution, a current of approximately 0.75 Amps is passed through the seed layer for a time on the order of 15 seconds. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue.

Figure 1F:
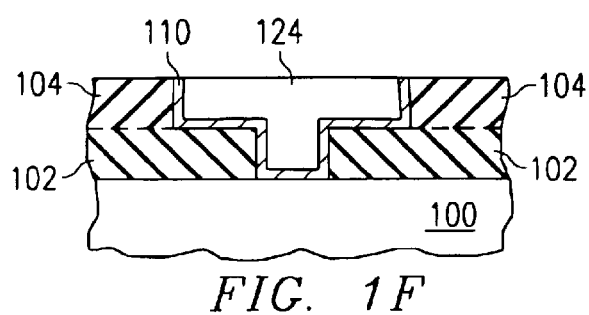

After copper ECD, the copper 124 and barrier 110 are chemically mechanically polished (CMP) to remove the material from above IMD 104. The resulting structure is shown in FIG. 1F. Next level ILD and IMD may be deposited and processing may then continue to form additional metal interconnect levels and package the device.

As a result of the D-W or D-W-D treatment according to the invention, the DUV pattern energy required to achieve the target CD (critical dimension) is reduced, the via sidewall angle is increased and the depth of focus (DOF) is increased. In one set of experiments, the exposure energy was reduced to between 30 and 35 mJ/cm$^2$ for both types of photoresist tested. In the baseline approach without pre-pattern treatment, the exposure energies varied from 40–80 mJ for one photoresist and 35–60 mJ for another photoresist. In the baseline approach, the via sidewall angle was typically less than 83° and a footing was present at the OSG surface. The via sidewall angle using the invention is increased to 85° and above. Moreover, the footing is eliminated. DOF between 0.4 µm and 6 µm were achieved using the invention. Whereas, without pre-pattern treatment, the DOF varied from not being able to print at all (0) and 0.4 µm.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the steps of:

forming a low-k dielectric layer over a semiconductor body;

treating said low-k dielectric layer with a reducing plasma;

treating said low-k dielectric layer with a wet solution after said plasma treating step;

forming a resist pattern over said low-k dielectric layer;

etching said low-k dielectric layer using said resist pattern; and treating said low-k dielectric layer to a $H_2$ plasma after said step of treating said low-k dielectric layer with wet solution and prior to forming said resist pattern.

2. The method of claim 1, wherein said reducing plasma comprises $H_2$ and $N_2$.

3. The method of claim 1, wherein said wet solution comprises HF.

4. The method of claim 1, wherein said low-k dielectric layer comprises organo-silicate glass.

5. The method claim 1, wherein said step of treating said low-k dielectric layer with said wet solution occurs prior to forming said resist pattern.

6. The method claim 1, wherein said treating steps remove said resist pattern as a pattern re-work step.

7. A method of fabricating an integrated circuit having copper metal interconnects comprising the steps of:

forming an interlevel dielectric (ILD) over a semiconductor body;

forming an intrametal dielectric (IMD) over the ILD;

plasma treating said IMD using $H_2$ and an inert gas;

treating said IMD using a wet solution after said plasma treating step;

forming a via resist pattern over said IMD;

etching a via in said IMD and ILD using said via resist pattern;

removing said via resist pattern;

at least partially filling said via with a material;

forming a trench resist pattern over said IMD;

etching a trench in said IMD using said trench resist pattern;

removing said trench resist pattern and said material in said via; and forming a copper interconnect in said via and said trench.

8. The method of claim 7, wherein said inert gas comprises Ar.

9. The method of claim 7, wherein said inert gas comprises $N_2$.

10. The method of claim 7, wherein said wet solution is selected from the group consisting of HF, organic acid, HF combined with citric acid, and $H_2SO_4$.

11. The method of claim 7, wherein said plasma treating step and said treating step occur prior to the step of forming the via resist pattern.

12. The method of claim 7, wherein said plasma treating step occurs after the step of forming the via resist pattern as a pattern re-work step.

13. The method of claim 7, further comprising the step of passivating said IMD using a $H_2$ plasma after said step of treating said IMD with a wet solution and prior to said step of etching a via.

14. The method of claim 7, wherein said plasma treating step end said treating step occur after the step of removing the via resist pattern and prior to the step of forming the trench resist pattern.

15. A method for fabricating an integrated circuit, comprising the steps of:

forming a low-k dielectric layer over a semiconductor body;

treating said low-k dielectric layer with a reducing plasma, wherein said reducing plasma comprises a $H_2$ and Ar;

treating said low-k dielectric layer with a wet solution;

forming a resist pattern over said low-k dielectric layer; and etching said low-k dielectric layer using said resist pattern.

16. A method for fabricating an integrated circuit, comprising the steps of:

forming a low-k dielectric layer over a semiconductor body;

treating said low-k dielectric layer with a reducing plasma;

treating said low-k dielectric layer with a wet solution, wherein said wet solution comprises an organic acid selected from the group consisting of citric, acetic, gallic, and oxallic;

forming a resist pattern over said low-k dielectric layer; and etching said low-k dielectric layer using said resist pattern.

* * * * *